United States Patent [19]

Kida et al.

[11] Patent Number: 5,354,446

[45] Date of Patent: Oct. 11, 1994

[54] CERAMIC ROTATABLE MAGNETRON SPUTTERING CATHODE TARGET AND PROCESS FOR ITS PRODUCTION

[75] Inventors: Otojiro Kida; Akira Mitsui; Atsushi Hayashi, all of Yokohama, Japan

[73] Assignee: Asahi Glass Company Ltd., Tokyo, Japan

[21] Appl. No.: 936,281

[22] Filed: Aug. 28, 1992

Related U.S. Application Data

[63] Continuation-in-part of Ser. No. 671,801, Apr. 22, 1991, abandoned, which is a continuation-in-part of Ser. No. 318,330, Mar. 3, 1989, Pat. No. 5,110,637.

[30] Foreign Application Priority Data

| Mar. 3, 1988 | [JP] | Japan | 63-48765 |
| Mar. 31, 1988 | [JP] | Japan | 63-76202 |
| Jun. 14, 1988 | [JP] | Japan | 63-144827 |
| Oct. 21, 1988 | [JP] | Japan | 63-264163 |
| Aug. 1, 1989 | [JP] | Japan | 1-197993 |
| Sep. 1, 1989 | [JP] | Japan | 1-224484 |
| Jun. 21, 1990 | [JP] | Japan | 2-161413 |
| Aug. 28, 1991 | [JP] | Japan | 3-242557 |
| Aug. 28, 1991 | [JP] | Japan | 3-242558 |

[51] Int. Cl.$^5$ ............................ C23C 14/34
[52] U.S. Cl. ................... 204/298.22; 204/298.21; 204/298.12
[58] Field of Search ........... 204/298.12, 298.19, 204/192.12, 298.21, 298.22

[56] References Cited

U.S. PATENT DOCUMENTS

| 3,395,091 | 7/1968 | Sinclair | 106/286.4 X |
| 3,620,957 | 11/1971 | Crawley et al. | 204/298.12 |
| 3,634,286 | 1/1972 | Yates | 106/286.4 X |
| 3,763,026 | 10/1973 | Cordes | 204/192.21 |
| 3,819,990 | 6/1974 | Hayashi et al. | 204/192.22 X |
| 4,063,211 | 12/1977 | Yasujima et al. | 204/192.23 X |
| 4,209,375 | 6/1980 | Gates et al. | 204/192.15 X |
| 4,290,876 | 9/1981 | Nishiyama et al. | 204/298.12 X |
| 4,356,073 | 10/1982 | McKelvey . | |
| 4,414,274 | 11/1983 | Hieber | 204/192.23 X |
| 4,476,151 | 10/1984 | Keller et al. | 204/298.12 |
| 4,569,745 | 2/1986 | Nagashima | 204/298.12 |
| 4,964,969 | 10/1990 | Kusakabe et al. | 204/298.12 |
| 4,966,676 | 10/1990 | Fukasawa et al. | 204/298.12 |
| 4,978,437 | 12/1990 | Wicz | 204/192.23 |
| 4,990,234 | 2/1991 | Szczyrbowski et al. | 204/192.23 |

FOREIGN PATENT DOCUMENTS

| 0374931 | 6/1990 | European Pat. Off. . | |
| 1493822 | 7/1967 | France . | |
| 55-110127 | 8/1980 | Japan . | |
| 58-500174 | 2/1983 | Japan . | |
| 60-181270 | 9/1985 | Japan . | |
| 61-144029 | 7/1986 | Japan . | |
| 61-145823 | 7/1986 | Japan . | |
| 62-73202 | 4/1987 | Japan . | |
| 0767044 | 9/1980 | U.S.S.R. | 106/286.4 |

OTHER PUBLICATIONS

Hoffmann et al., "DC Reactive Sputtering Using A Rotating Cylindrical Magnetron", Air Co Coating Technology, dated unknown.

Patent Abstracts of Japan, JP-61-145823, Jul. 3, 1986, Masao Mashita, et al., "Molecular Beam Epitaxial Growth Method".

Patent Abstracts of Japan, JP-61-144029, Jul. 1, 1986, Tadashi Serikawa, "Method And Apparatus For Manufacturing Silicon Oxide Film Containing Phosphorus".

(List continued on next page.)

*Primary Examiner*—Nam Nguyen
*Attorney, Agent, or Firm*—Oblon, Spivak, McClelland, Maier & Neustadt

[57] ABSTRACT

A ceramics rotatable magnetron sputtering cathode target comprising a cylindrical target holder and a ceramics layer as a target to be sputtered, formed on the outer surface of the target holder, wherein at least one layer selected from the group consisting of a layer of a metal or alloy having a thermal expansion coefficient of an intermediate level between the thermal expansion coefficients of the ceramics layer and the target holder, and a layer of a metal or alloy having a thermal expansion coefficient approximating to the thermal expansion coefficient of the ceramics layer, is formed as an undercoat between the ceramics layer and the target holder.

3 Claims, 1 Drawing Sheet

OTHER PUBLICATIONS

Patent Abstracts of Japan, JP-67-73202, Apr. 3, 1987, Yoshiharu Oi, "Production Of Thin Optical Film".

Patent Abstracts of Japan, JP-55-110127, Aug. 25, 1980, Makoto Azuma, et al., "Preparation Of Plastic Antireflection Film".

Chemical Abstracts, vol. 97, No. 22, Feb. 1982, p. 300, abstract No. 187013z, Columbus, Ohio, US; & JP-A-82 100 943 (Asahi Glass Co., Ltd. Murakami Kaimeido K.K.) Jun. 23, 1982 *whole abstract*.

Chemical Abstracts, vol. 97, No. 22, Feb. 1982, p. 300, abstract No. 187014a, Columbus, Ohio, US; & JP-A-82 100 912 (Asahi Glass Co., Ltd. Murakami Kaimeido K.K.) Jun. 23, 1982 *whole abstract*.

Chemical Abstracts, vol. 97, No. 22, Feb. 1982, p. 300, abstract No. 187015b, Columbus, Ohio, US; & JP-A-82 100 940 (Asahi Glass Co., Ltd. Murakami Kaimeido K.K.) Jun. 23, 1982 *whole abstract*.

Chemical Abstracts, vol. 92, p. 264, abstract No. 219710q, Columbus, Ohio, US; T. Stefaniak: "Protecting Properties and behavior of antireflection coatings", & Opt. Appl. 1979, 9(4), 277-9 *whole abstract*.

FIGURE 1

CERAMIC ROTATABLE MAGNETRON SPUTTERING CATHODE TARGET AND PROCESS FOR ITS PRODUCTION

This application is a continuation-in-part application of the application Ser. No. 07/671,801 having a filing date of Apr. 22, 1991 abandoned, which is a continuation-in-part application of the application Ser. No. 07/318,330 having a filing date of Mar. 3, 1989, now U.S. Pat. No. 5,110.637.

BACKGROUND OF THE INVENTION

Field Of The Invention

The present invention relates to a ceramic rotatable magnetron sputtering cathode target to be used for forming a ceramic film, particularly a transparent non-crystalline oxide film having excellent durability or a transparent oxide film having a low refractive index, by sputtering, and a process for its production.

Discussion Of Background

Heretofore, it has been known to impart an optical function by forming a thin film on a transparent substrate such as glass or plastic, for example, an anti-reflective coating on a mirror, a heat radiation reflecting glass, a low emissivity glass, an interference filter, a camera lens or an eye glass.

In the case of a usual mirror, a film of Ag is formed by an electroless plating method, or a film of Al or Cr is formed by a vacuum deposition method or a sputtering method. Among such films, a Cr film is relatively tough and is used as a surface-coated mirror with the coating surface exposed.

In the case of a heat radiation reflecting glass, it has been common to form a film of titanium oxide or tin oxide by a spraying method, a CVD (chemical vapor deposition) method or a dipping method. Recently, it has become common to employ a heat radiation reflecting glass having a metal film, a nitride film or a tin-doped indium oxide (ITO) film formed on a glass surface by a sputtering method. With the sputtering method, the film thickness can easily be controlled, and a plurality of films can continuously be formed, whereby it is possible to design e.g. the transmittance, the reflectance and the color by a combination with transparent oxide films. Therefore, the demand is increasing in such a field as building construction where a design or appearance is of importance.

A low emissivity glass which reflects a radiant heat from a wall or an air conditioner in a room to the inside of the room, usually has a structure having a silver layer sandwiched between zinc oxide layers such as a three-layered system of ZnO/Ag/ZnO or a five-layered system of ZnO/Ag/ZnO/Ag/ZnO, and thus is used in the form of a multi-layered glass or laminated glass. In recent years, this glass has found a remarkable spread of use in cold areas in Europe.

The anti-reflective coating for lenses, etc. is usually formed by alternately laminating a high refractive index film such as titanium oxide or zirconium oxide and a low refractive index film such as silicon oxide or magnesium fluoride. Usually, a vacuum deposition method is employed, and the substrate is heated during the film forming operation to improve the scratch resistance.

The surface-coated mirror, the heat radiation reflecting glass of a single plate form or the anti-reflective coating for lenses, etc., is used under such a condition that the coated film is exposed to the air. Therefore, it is required to be excellent in the chemical stability and the abrasion resistance. On the other hand, the low emissivity glass is also likely to be damaged, for example, by scratching during the transportation or handling prior to being formed into a multi-layered glass or laminated glass. Therefore, a protecting film or an optical thin film serving also as a protecting film, which is excellent in the stability and the abrasion resistance, is desired.

To improve the durability, it has been common to provide a chemically stable transparent oxide film on the air side. As such an oxide film, a film of titanium oxide, tin oxide, tantalum oxide, zirconium oxide or silicon oxide may be mentioned, and such an oxide film has been selected for use depending upon the required properties.

Titanium oxide and zirconium oxide are excellent in the chemical stability, but they tend to form crystalline films and the surface roughness tends to be substantial, whereby the friction will be large when they are abraded, and they are inferior in the abrasion resistance. On the other hand, tin oxide and silicon oxide are, respectively, poor in the acid and alkali resistance, and they are not durable when immersed in an acidic or alkaline solution for a long period of time. Among them, tantalum oxide has both of the abrasion resistance and the chemical stability, but its abrasion resistance is not fully satisfactory.

Further, titanium oxide, tin oxide, tantalum oxide and zirconium oxide have relatively high refractive indices, whereas silicon oxide has a relatively low refractive index. Thus, there is a limitation in the degree of freedom for optical designs to impart various optical functions.

It is therefore desired to develop a thin film having a high level of durability and a high degree of freedom for a wide range of optical designs. In Japanese Patent Application No. 47133/1990, the present applicants have proposed, as such a highly durable thin film, a target comprising, as the main components, at least one member selected from the group consisting of Zr, Ti, Hf, Sn, Ta, In and Cr and at least one member selected from the group consisting of B (boron), Si (silicon) and O (oxygen), and a non-crystalline oxide film formed by sputtering the target.

On the other hand, with respect to a transparent thin film having a low refractive index, it has been common to provide a chemically stable transparent oxide film on the air side in order to improve the durability, as mentioned above. As such an oxide film, a film of titanium oxide, tin oxide, tantalum oxide, zirconium oxide or silicon oxide may, for example, be mentioned, and as a typical film having a low refractive index, magnesium fluoride may, for example, be mentioned. Such an oxide film has been selected for use depending upon the desired properties. Titanium oxide, tin oxide, tantalum oxide and zirconium oxide have high refractive indices, whereas silicon oxide and magnesium fluoride have low refractive indices.

However, such a film can hardly be formed on a substrate having a large area and can not be applied to an object where formation of a film covering a large area is required, such as glass for buildings or glass for automobiles. A DC (direct current) sputtering method is most suitable for forming a film with a large area. However, there has been no target material suitable for providing a transparent thin film having a low refractive index. Thus, it has been impossible to obtain a desired thin film by means of a DC sputtering method which is capable of forming a film with a large area.

For example, in order to form a silicon dioxide thin film by a DC sputtering method, it is conceivable to employ a method wherein an electrically conductive Si target is subjected to reactive sputtering in an oxygen-containing atmosphere to from a silicon dioxide thin film. However, the surface of such Si target is oxidized during the sputtering, whereby the conductivity decreases, and sputtering can hardly be continued under a stabilized condition. Further, the formed silicon dioxide thin film has poor durability against alkalinity and is not durable when dipped in an alkaline solution for a long period of time.

Under these circumstances, the present applicants have proposed in Japanese Patent Application No. 201149/1990 a non-crystalline oxide thin film and a target which has high durability and a low refractive index as well as a high degree of freedom for a wide range of optical designs.

On the other hand, a planar target for sputtering is prepared through a long series of process steps including mixing of inorganic compounds as raw materials, followed by molding, calcination and processing to a shape suitable for the sputtering apparatus and bonding. In the molding, calcination, processing and bonding steps among them, a large scale apparatus is required for the preparation of a large size target for a production machine, although no such a large scale apparatus is required when the target is small in size. Further, in the bonding step, when a ceramic target is to be bonded on a target holder metal plate, it is divided for processing and bonding, whereby a large scale apparatus and a large amount of an expensive indium solder are required, and thus a substantial labor force and costs are required.

Further, in sputtering of a glass sheet with large area for buildings, a high sputtering power is applied to increase the film-forming speed in order to increase the productivity. However, cooling of the target limits the film-forming speed and causes troubles such as peeling and cracking of the target. A rotatable magnetron sputtering cathode target of new type having such aspects improved, is known. This is of a type where a magnetic field-generating means is disposed inside a cylindrical target, and sputtering is conducted while rotating the target and cooling the target from inside, whereby a power larger per unit area than the planar target, can be applied, and accordingly film-forming can be conducted at a high speed. In most cases, such a target is a cylindrical rotatable cathode made of a metal or alloy to be sputtered, and when the substance to be sputtered is a soft or brittle metal or alloy, such a substance is formed on a cylindrical target holder.

In the case of a metal target, a multi-layered film coating of e.g. the oxide, nitride and carbide, is possible using various sputtering atmospheres, but it has drawbacks such that the coating film is likely to be damaged by different types of atmospheres so that the desired composition can not be obtained and in the case of a low melting point metal target, it is likely to be melted when a power is applied too much. Therefore, a ceramic target has been desired.

Further, a method of preparing a sputtering target by thermal spraying, has been proposed. However, this method has problems such that the difference in the thermal expansion between the ceramic and the metal is so large that the spray coating film can not be made thick, and that due to the thermal shock during the use, the adhesion of the film tends to deteriorate, thus resulting in its peeling. Further, there is a method wherein a sintered body of ceramic is prepared in the form of a cylinder, and it is bonded to a target holder material by means of indium metal. However, this method is cumbersome and costly.

SUMMARY OF THE INVENTION

It is an object of the present invention to solve the above-mentioned problems.

The present invention provides a ceramic rotatable magnetron sputtering cathode target comprising a cylindrical target holder and a ceramic layer as a target to be sputtered, formed on the outer surface of the target holder, wherein at least one layer selected from the group consisting of a layer of a metal or alloy having a thermal expansion coefficient of an intermediate level between the thermal expansion coefficients of the ceramic layer and the target holder, and a layer of a metal or alloy having a thermal expansion coefficient approximating to the thermal expansion coefficient of the ceramic layer, is formed as an undercoat between the ceramic layer and the target holder.

Further, as a first process for producing such a target, the present invention provides a process for producing a ceramic rotatable magnetron sputtering cathode target, which comprises roughening the outer surface of a cylindrical target holder, forming thereon at least one layer selected from the group consisting of a layer of a metal or alloy having a thermal expansion coefficient of an intermediate level between the thermal expansion coefficients of a ceramic layer to be formed later and the target holder, and a layer of a metal or alloy having a thermal expansion coefficient approximating the thermal expansion coefficient of the ceramic layer, as an undercoat, and then forming a ceramic layer as a target to be sputtered, by heating a ceramic powder in a high temperature gas to a semi-molten state and transporting and depositing it on the undercoat by this gas.

Furthermore, as a second process for producing such a target, the present invention provides a process for producing a ceramic rotatable magnetron sputtering cathode target, which comprises roughening the outer surface of a cylindrical target holder, forming thereon at least one layer selected from the group consisting of a layer of a metal or alloy having a thermal expansion coefficient of an intermediate level between the thermal expansion coefficient of a ceramic layer to be formed later and the target holder, and a layer of a metal or alloy having a thermal expansion coefficient approximating the thermal expansion coefficient of the ceramic layer, as an undercoat by plasma spraying, then disposing a ceramic powder or a compact of such a powder around the outer surface of the cylindrical target holder, followed by hot isostatic pressing.

DETAILED DESCRIPTION OF THE PREFERRED EMBODIMENTS

Now, the first process of the present invention will be described.

The first process of the present invention is basically such that a ceramic powder is heated to a semi-molten state, for example, by means of a plasma spraying apparatus and sprayed and deposited on a target holder to directly form a ceramic layer as a target. This process does not require a step of compacting the powder in a mold, followed by press molding, a step of sintering a molded product in an electric furnace or a step of sintering by hot pressing, a step of working or correcting to a proper shape, or a step of bonding the ceramics and the holder. However, this process requires a step to obtain a powder for spraying. Particularly, in a case of a complicated compound which can not be readily commercially available, it is prepared by a chemical synthesis or a solid phase reaction. The powder thus obtained is pulverized and classified to adjust the particle size so that the powder is flowable and suitable for thermal spraying.

The ceramic powder to be used in the present invention for the preparation of a target useful to form a highly durable non-crystalline oxide film, may be prepared, for example, by the following method. A powder or a powder mixture of e.g. Zr, B, Si, $ZrB_2$, $ZrSi_2$, $ZrO_2$ (including stabilized or partially stabilized $ZrO_2$ having $Y_2O_3$, CaO, MgO, etc. incorporated in an amount of from 3 to 8 mol %), $B_2O_3$, $SiO_2$, etc., or when a non-oxide target is to be formed, such a powder or powder mixture having a carbon powder incorporated to reduce the oxide, as the case requires, is calcined in a furnace of a high temperature atmosphere utilizing a chemical synthesis or a solid phase reaction, to obtain a bulky single system or composite system powder. A similar method may be employed in the case of a boride or silicide of a metal such as Ti, Ta, Hf, Mo, W, Nb, Sn, La, In or Cr.

The ceramic layer in the target useful to form a transparent oxide film having a low refractive index of the present invention, comprises, as the main components, at least one member (hereinafter referred to as metal M) selected from the group consisting of Zr, Ti, Ta, Hf, Mo, W, Nb, Sn, La, In and Cr, and Si, wherein the atomic ratio of the total amount of metal M to Si (M:Si) is within a range of from 4:96 to 35:65. It is particularly preferred that the atomic ratio is within a range of from 4:96 to 15:85, since the refractive index of a thin film thereby formed, will be very low at a level of not higher than 1.6. If the content of metal M such as Zr is less than 4 atomic % based on the total amount including Si, it becomes difficult to conduct sputtering under a stabilized condition due to surface oxidation of the target, and the alkali resistance of the resulting thin film (such as a film of oxides of Zr and Si) will be poor. If the content of metal M such as Zr is larger than 35 atomic % based on the total amount including Si, the refractive index of the resulting thin film tends to be high, such being undesirable.

The ceramic powder to be used in the present invention for the preparation of such a target useful to form a transparent oxide film having a low refractive index, may be prepared, for example, by the following method. A powder or a powder mixture of metal M such as Zr, or Si, $ZrSi_2$, $ZrO_2$ (including stabilized or partially stabilized $ZrO_2$ having $Y_2O_3$, CaO, MgO, etc. incorporated in an amount of from 3 to 8 mol %), $SiO_2$, etc., or when a non-oxide target is to be prepared, such a powder or a powder mixture having a carbon powder incorporated to reduce the oxide, as the case requires, is calcined in a furnace of a high temperature atmosphere utilizing a chemical synthesis or a solid phase reaction, to obtain a bulky single system or composite system powder.

In either case, such a powder is preferably pulverized and classified to a particle size of from 10 to 75 μm to obtain a ceramic powder for thermal spraying. If the particle size exceeds 75 μm, the powder tends to be hardly formed into a semi-molten state in a high temperature gas. On the other hand, if the particle size is smaller than 10 μm, the powder tends to be dispersed in the gas during the spraying, whereby it can hardly be deposited on the target holder.

In either case, such a ceramic powder may contain Fe, Al, Mg, Y, Mn and H in a total amount of at most 3% by weight. Further, carbon may be contained in an amount of at most 20% by weight, since carbon will be eliminated in the form of $CO_2$ during the film-forming process. Further, the powder may contain Cu, V, Co, Rh, Ir, etc. at a level of impurities.

The cylindrical target holder may be made of stainless steel or copper, or Ti or Mo having a thermal expansion coefficient approximating to the thermal expansion coefficient of the ceramic layer. Prior to thermal spraying of the ceramic powder, the outer surface of the holder is roughened, for example, by sandblasting by means of abrasive particles of $Al_2O_3$ or SiC, in order to improve the adhesion. Otherwise, it is preferred that prior to thermal spraying of the ceramic powder, its outer surface is worked to have a thread or V-shape groove and then roughened by sandblasting by means of abrasive particles such as $Al_2O_3$ or SiC to improve the adhesion.

On the cylindrical target holder having the outer surface roughened, an undercoat is preferably formed to reduce the difference in the thermal expansion between the ceramic layer and the target holder and to increase the adhesive strength so that the coated film will be durable against peeling due to the thermal shock during the sputtering operation. As such an undercoat, at least one layer selected from the group consisting of a layer (hereinafter referred to as layer A) of a metal or alloy having a thermal expansion coefficient of an intermediate level between the thermal expansion coefficients of the target holder and the target material, and a layer (hereinafter referred to as layer B) of a metal or alloy having a thermal expansion coefficient close to the thermal expansion coefficient of the target material, is preferably formed by plasma spraying a powder of such a metal or alloy. It is most preferred to form both layers so that the target will have a structure of target holder/layer A/layer B/target material. Even in a case wherein only layer B is formed as the undercoat, the adhesive strength of the target material to the target holder can be increased because the metal or alloy layer has high elasticity and low brittleness. The thermal expansion coefficient of layer B is preferably within a range of $\pm 2 \times 10^{-6}/°C$. of the thermal expansion coefficient of the ceramic layer.

As a material for the undercoat, a conductive powder of e.g. Mo, Ti, Ni, Nb, Ta, W, Ni—Al, Ni—Cr, Ni—Cr—Al, Ni—Cr—Al—Y or Ni—Co—Cr—Al—Y, can be used. The thickness of the undercoat is preferably within a range of from 30 to 100 μm.

Specifically, the material for the undercoat varies depending upon the thermal expansion coefficient of the ceramic layer. (The thermal expansion coefficient of e.g. Cu or SUS 304 which is useful for the target holder, is $17-18 \times 10^{-6}/°C$.).

For example, when the ceramic layer is a Zr—B type, a Zr—B—Si type, a Hf—Si type, a Ti—B type, a Cr—Si type, a Sn—Si type or a Zr—Si type (the atomic ratio of Zr to Si being less than 33/67) (the thermal expansion coefficient being $5-6\times10^{-6}/°C.$), the thermal expansion coefficient of the undercoat layer A is preferably $12-15\times10^{-6}/°C.$, and as such a material, Ni, Ni—Al, Ni—Cr, Ni—Cr—Al, Ni—Cr—Al—Y or Ni—Co—Cr—Al—Y may, for example, be mentioned. The thermal expansion coefficient of the undercoat layer B is preferably $5-8\times10^{-6}/°C.$, and as such a material, Mo, W, Ta or Nb may, for example, be mentioned.

When the ceramic layer is a Ta—B type, a Ta—Si type, a Ti—Si type (the atomic ratio of Ti being less than 33/67) or a Zr—Si type (the atomic ratio of Zr to Si being at least 33/67) (the thermal expansion coefficient being $8-9\times10^{-6}/°C.$), the thermal expansion coefficient of the undercoat layer A is preferably $12-15\times10^{-6}/°C.$, and as such a material, Ni, Ni—Al, Ni—Cr, Ni—Cr—Al, Ni—Cr—Al—Y or Ni—Co—Cr—Al—Y may, for example, be mentioned. The thermal expansion coefficient of the undercoat layer B is preferably $8-10\times10^{-6}/°C.$, and as such a material, Ti or Nb may, for example, be mentioned.

Further, when the ceramic layer is a Cr—B type or Ti—Si type (the atomic ratio of Ti being at least 33/67) (thermal expansion coefficient being $10-13\times10^{-6}/°C.$), the thermal expansion coefficient of the undercoat is preferably $10-13\times10^{-6}/°C.$, and as such a material, Ni, Ni—Al, Ni—Cr, Ni—Cr—Al, Ni—Cr—Al—Y or Ni—Co—Cr—Al—Y may, for example, be mentioned. In a case where the difference in the thermal expansion coefficient between the ceramic layer and the target holder is small as in this case, the undercoat may be a single layer. Otherwise, two layers i.e. a layer having a thermal expansion coefficient close to the thermal expansion coefficient of the target holder and a layer having a thermal expansion coefficient close to the thermal expansion coefficient of the ceramic layer, may be provided by changing the compositional ratios of such materials for the undercoat.

Then, while heating the above ceramic powder in a high temperature gas, preferably a high temperature gas under a non-oxidizing atmosphere such as Ar, $N_2$ or He or a high temperature gas under a non-oxidizing atmosphere (such as Ar, $N_2$ or He) under reduced pressure, to a semi-molten state, such a semi-molten ceramic powder is transported by this gas and deposited on the above-mentioned undercoat to form a ceramic layer as a target to be sputtered. It is particularly preferred to form such a ceramic layer by a plasma spraying method conducted in a high temperature plasma, preferably a high temperature plasma under a non-oxidizing atmosphere or a high temperature plasma under a non-oxidizing atmosphere under reduced pressure. By the insertion of the above-mentioned undercoat, it is possible to form a stable ceramic layer of at least from 2 to 5 mm.

Further, the above-mentioned undercoat may also be preferably formed by a plasma spraying method in a high temperature plasma, preferably in a high temperature plasma under a non-oxidizing atmosphere or in a high temperature plasma under a non-oxidizing atmosphere under reduced pressure.

When the ceramic powder is heated in a high temperature gas under a non-oxidizing atmosphere or under a non-oxidizing atmosphere under reduced pressure to a semi-molten state and deposited on the undercoat to form a ceramic layer, there will be no substantial oxidation of the ceramic powder during the formation of a ceramic layer, whereby it is possible to form a uniform ceramic layer without change in the chemical composition.

Now, the second process of the present invention will be described.

The second process of the present invention is basically such that a ceramic powder is sintered and bonded to a target holder by hot isostatic pressing (hereinafter referred to as HIP treatment) to directly form a ceramic layer as a target. This process does not require a step of compacting the powder in a mold, followed by press molding, a step of sintering the molded product in an electric furnace, a step of sintering by hot pressing, a step of working or correcting to a proper shape, or a step of bonding the ceramic to the holder.

The second process of the present invention comprises a step of obtaining a powder of raw materials, a step of treating the outer surface of a cylindrical target holder for surface treatment to intimately bond it to a ceramic layer and a step of sintering and bonding by the HIP treatment.

In a case where the ceramic powder to be used in the present invention is a complicated compound which can not be readily commercially available, it may be prepared by a chemical synthesis or a solid phase reaction. The powder thus obtained is pulverized and granulated to have such a secondary particle size that the powder is flowable and can readily be packed into a capsule for HIP treatment.

The ceramic powder to be used in the second process and the preparation thereof may be the same as described above with respect to the first process.

This powder is pulverized to an average particle size of at most 1 μm, and a binder is added thereto to obtain a slurry. The slurry is granulated by a spray drier to obtain a powder granulated to secondary particles. This granulated powder preferably has a particle size of at most 150 μm, particularly an average particle size of 80 μm, with good flowability whereby a packed compact having excellent packing density can be obtained.

As the cylindrical target holder, the same as described with respect to the first process, can be used.

On the cylindrical target holder having the outer surface roughened, it is preferred to form an undercoat to reduce the difference in the thermal expansion between the target holder and the ceramic layer as a target, to minimize formation of a thermal stress during the sintering and bonding by HIP treatment and to increase the adhesive strength so that the coated film is durable against peeling due to the thermal shock during the sputtering. As such an undercoat, the same material as described with respect to the first process can be used. The thickness of the undercoat is also as described above.

Figure 1:
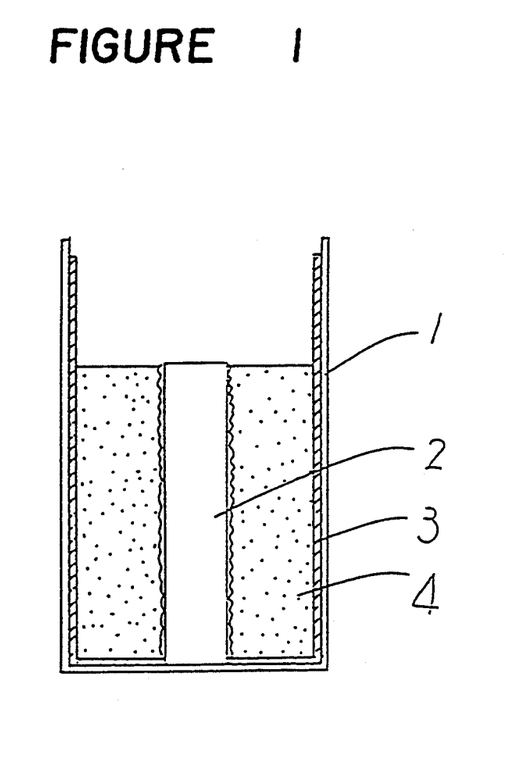
FIG. 1 is a cross sectional view of a capsule for hot isostatic press treatment to be used for the second process of the present invention.

Then, the target holder thus provided with an undercoat, is placed in a capsule for HIP treatment as shown in FIG. 1, and the above-mentioned granulated ceramic powder is packed in the capsule, followed by HIP treatment for sintering and bonding.

The capsule for HIP treatment will be described with reference to FIG. 1. The capsule for HIP treatment comprises a bottomed stainless steel capsule 1 and a cylindrical target holder 2 placed therein. The components are fixed at the predetermined positions. Namely, the cylindrical target holder 2 is fixed by welding at the center of the bottom of the bottomed stainless steel capsule 1. This capsule for HIP treatment is preferably made of steel or stainless steel, and the thickness of the capsule is preferably at most 4 mm.

Further, this capsule 1 for HIP treatment may preferably have an alumina fiber paper (0.5 to 1 mm in thickness) or sheet 3 bonded or an $Al_2O_3$ powder coated by plasma spraying on the inner surface of the stainless steel capsule 1 for HIP treatment to suppress the reaction in the sintering with the above-mentioned ceramic powder packed in the interior of the capsule during the HIP treatment step or to facilitate the release from the ceramic layer after the HIP treatment.

The above-mentioned ceramic powder 4 is packed in the space between the stainless steel capsule 1 and the cylindrical target holder 2. Otherwise, it is possible to employ a method wherein a preliminarily surface-treated cylindrical target holder 2 is used, and such a cylindrical target holder 2 is placed in a CIP (cold isostatic press) molding rubber mold, then the above-mentioned ceramic powder 4 is filled between the space, followed by preliminary CIP molding to form a cylindrical compact of the ceramic powder.

After packing the ceramic powder in the stainless steel capsule for HIP treatment as mentioned above, or after placing the ceramic compact formed on the cylindrical target holder by preliminary CIP molding, in the capsule for HIP treatment, this stainless steel capsule for HIP treatment is evacuated and sealed under a reduced pressure of not higher than $10^{-3}$ mmHg. If the pressure is higher than $10^{-3}$ mmHg, no adequate removal of gas or other components deposited on the ceramic powder raw material can be done.

The stainless steel HIP capsule thus sealed under a reduced pressure, is placed in a HIP apparatus and subjected to HIP treatment. The HIP treatment is conducted using an inert gas (Ar) under a high temperature and high pressure condition as pressure medium so that sintering of the ceramic powder or the preliminarily molded ceramic compact placed in the capsule and bonding of the above-mentioned ceramic layer to the target holder are carried out simultaneously. Here, the HIP treatment is conducted preferably at a temperature of from 900° to 1,200° C. under a pressure of at least 50 MPa for at least one hour. If the HIP treatment conditions are such that the temperature is lower than 900° C. and the pressure is lower than 50 MPa, the density of the ceramic layer tends to be low, and the adhesion of the ceramic layer to the target holder tends to be poor. On the other hand, if the temperature exceeds 1,200° C. and the pressure is lower than 50 MPa, the reaction with the target holder tends to be vigorous, such being undesirable The stainless steel capsule for HIP treatment thus treated by HIP treatment, is taken out from the HIP apparatus, and the stainless steel capsule is peeled off to obtain a ceramic rotatable magnetron sputtering cathode target. In this manner, a ceramic rotatable magnetron sputtering cathode target having a dense ceramic layer of from 2 to 10 mm excellent in the adhesion to the target holder, can be obtained.

The rotatable magnetron sputtering cathode target prepared by the first or second process of the present invention provides good heat conduction from the target material to the target holder and further to the cathode electrode, and the ceramic layer is firmly adhered to the target holder, whereby cooling can be adequately conducted even when a high sputtering power is applied to increase the film-forming speed, and a large electric powder per unit area can be applied without peeling or cracking of the target due to an abrupt thermal shock.

Further, when the ceramic layer is formed by the first process of the present invention in a non-oxidizing atmosphere or in a non-oxidizing atmosphere under reduced pressure, or when the ceramic layer is formed by the second process of the present invention, oxidation during the formation of the ceramic layer is little, and there is no substantial change in the chemical composition, whereby a uniform target can be formed.

Further, there is a merit that the utilization efficiency of the target is high as compared with a planar type, since the erosion zone of the target will be over the entire surface. Further, even when the eroded portion of the target becomes thin, the target material can be supplemented by thermal spraying to the portion where the target material has decreased, or a ceramic powder of the same material can be applied by HIP treatment to regain the initial state. Further, it is readily possible to let the thickness of the target have a distribution, whereby the distribution of the thickness of the resulting thin film can be controlled by letting the intensity of the magnetic field at the target surface or the temperature have a distribution.

When the first or second process of the present invention is employed for a conventional planar type target, a homogeneous target having a high density can readily be produced without requiring bonding of the target to the target holder, and any eroded portion can be regenerated.

Further, the ceramic rotatable magnetron sputtering cathode target of the present invention may be used for both DC and RF sputtering apparatus for magnetron sputtering, whereby a film can be formed under a stabilized condition at a high film-forming speed and at a high utilization efficiency of the target.

The thin film formed by using the ceramic rotatable magnetron sputtering cathode target for a highly durable non-crystalline oxide film of the present invention, is non-crystalline, since B and/or Si is added to an oxide of e.g. Zr, Ti, Ta, Hf, Mo, W, Nb, Sn, La, In or Cr. This is believed due to a fact that B and/or Si destroys the lattice of such an oxide and prevents the growth of crystals of the oxide, so that the film tends to be non-crystalline. The surface roughness of the film is believed to be less with a non-crystalline film than with a film made of fine crystals. This is believed to be the reason why the non-crystalline oxide film of the present invention has a low friction coefficient.

The non-crystalline film formed by using the target of the present invention is thus excellent in the lubricating property and scarcely damaged by friction because of the smooth surface, whereby high abrasion resistance and high scratching resistance can be obtained.

A low refractive index film comprising oxides of Si and at least one member (hereinafter referred to as metal M) selected from the group consisting of Zr, Ti, Ta, Hf, Mo, W, Nb, Sn, La, In and Cr, can be formed uniformly and at a high speed, when sputtering is conducted using the ceramic rotatable magnetron sputtering cathode target for forming a transparent oxide film having a low refractive index of the present invention in an atmosphere of a mixture of Ar and $O_2$ under a vacuum at a usual level of from $1 \times 10^{-3}$ to $1 \times 10^{-2}$ Torr.

The target for forming a transparent oxide film having a low refractive index of the present invention has electrical conductivity and scarcely undergoes the surface oxidation of the target during sputtering, whereby film forming can be conducted by a direct current (DC) sputtering method, and a uniform film with a large area can be formed at a high speed. This is believed attributable to the fact that Zr, Ti, Ta, Hf, Mo, W, Nb, La, In, Cr, etc. in the target are present mostly in the form of silicon compounds, and Sn is present in the form of a Si—Sn alloy, and thus they are less active than Si against oxygen and less susceptible to oxidation, and thus they serve to suppress a decrease of electrical conductivity due to the surface oxidation of the target.

Now, the present invention will be described in further detail with reference to examples. However, it should be understood that the present invention is by no means restricted to such specific examples.

Firstly, examples for the production of targets useful for forming highly durable non-crystalline oxide films will be described.

EXAMPLE 1

One Undercoat Layer, Ar Gas Plasma

A mixture comprising $ZrO_2$, $B_2O_3$ and carbon, as a raw material of the ceramic powder for thermal spraying, was reacted at a high temperature in a non-oxidizing atmosphere to obtain a bulky sintered product. This sintered product was pulverized and classified to obtain a $ZrB_2$ powder having a purity of 99.5% and a particle size of from 20 to 45 $\mu$m.

A cylindrical target holder made of copper having an inner diameter of 50.5 mm, an outer diameter of 67.5 mm and a length of 406 mm, was attached to a lathe, and its outer surface was sand-blasted with $Al_2O_3$ abrasive particles to form a roughened surface. Then, an alloy powder of Ni—Al (9:1) was plasma-sprayed (by means of Metco thermal spraying machine) to form a coating film having a thickness of 50 $\mu$m as an undercoat. This plasma spraying was conducted using Ar gas as the plasma gas at a flow rate of 42.5 l/min by applying a powder of 700 A.35 kV, whereby the alloy powder of Ni—Al (9:1) was instantaneously heated by the Ar gas plasma at a temperature of from 10,000° to 20,000° C. and transported together with the gas to the target holder and condensed thereon. The undercoat was formed by laterally reciprocating a plasma spray gun many times while rotating the target holder by a lathe.

Then, using the above-mentioned $ZrB_2$ powder, plasma spraying was conducted in a similar manner to obtain a rotatable magnetron sputtering cathode target having $ZrB_2$ coated in a final thickness of 3 mm.

The rotatable magnetron sputtering cathode target of $ZrB_2$ thus obtained was mounted on a magnetron sputtering apparatus, and a $ZrB_xO_y$ film (atomic ratio of Zr:B:O=1:2:5) was formed on a glass substrate. The sputtering was conducted under a vacuum of from $1 \times 10^{-3}$ to $1 \times 10^{-2}$ Torr in an atmosphere of a mixture of Ar+$O_2$, to obtain a transparent non-crystalline oxide film of 1,000 Å.

The above target had better thermal shock resistance than a planar type target which was prepared by molding a ceramic by a conventional ceramic technique and bonding it to a target holder. With the target prepared by the conventional method, cracking occurs upon application of a sputtering power of about 2.5 kW. Whereas, with the rotatable target of the present invention, no cracking was observed at 5 kW, and film-forming was conducted under a stabilized condition without arcing, and a high film-forming speed of 100 Å/sec was obtained which corresponded to about four times of the film-forming speed of 25 Å/sec by the conventional method.

EXAMPLE 2

One Undercoat Layer, Ar Gas Plasma

A mixture comprising $ZrO_2$, $SiO_2$ and carbon powder, as a raw material of ceramic powder for thermal spraying, was reacted at a high temperature in a non-oxidizing atmosphere to obtain a bulky sintered product. This sintered product was pulverized and classified to obtain a $ZrSi_2$ powder having a purity of 99.5% and a particle size of from 20 to 75 $\mu$m. Using this powder, a rotatable target was prepared in the same manner as in Example 1, and film-forming was conducted by a magnetron sputtering apparatus. As a result, a transparent thin film of $ZrSi_xO_y$ (atomic ratio of Zr:Si:O=1:2:6) having a thickness of 1,000 Å, was obtained. Like the case of the $ZrB_2$ target in Example 1, a film-forming speed of about four times higher than the speed with a planar type target prepared by the conventional ceramic technique, was obtained, and no damage was observed even when a higher power was applied.

EXAMPLE 3

One Undercoat Layer, Ar Gas Plasma

A mixture comprising $ZrO_2$, $SiO_2$, $B_2O_3$ and carbon powder, as a raw material for thermal spraying, was reacted at a high temperature in a non-oxidizing atmosphere to obtain a bulky sintered product. This bulky product was pulverized and classified to obtain a powder of Zr—B—Si (atomic ratio of 1:1:8) having a purity of 99.5% and a particle size of from 20 to 75 $\mu$m. Using this powder, a rotatable target was prepared in the same manner as in Example 1, and film-forming was conducted by a sputtering apparatus. As a result, a transparent thin film of $ZrB_xSi_yO_z$ (atomic ratio of Zr:B:Si:O=1:1:8:18.5) having a thickness of 1,000 Å, was obtained. Like the cases of $ZrB_2$ and $ZrSi_2$ targets in Examples 1 and 2, a film-forming speed of about 3.5 times higher than the speed with a planar type target prepared by the conventional method, was obtained, and no cracking or damage was observed even when a higher powder was applied, and film-forming was conducted at a high speed under a stabilized condition.

EXAMPLE 4

Two undercoat Layers, Ar Gas Plasma

A mixture comprising $ZrO_2$, $B_2O_3$ and carbon, as a raw material for ceramic powder for thermal spraying, was reacted at a high temperature in a non-oxidizing atmosphere to obtain a bulky sintered product. This sintered product was pulverized and classified to obtain a $ZrB_2$ powder having a purity of 99.5% and a particle size of from 20 to 45 $\mu$m.

A cylindrical target holder made of copper having an inner diameter of 50.5 mm, an outer diameter of 67.5 mm and a length of 406 mm, was attached to a lathe, and its outer surface was threaded and further sand-blasted with $Al_2O_3$ abrasive particles to obtain a roughened surface. Then, an alloy powder of Ni—Al (weight ratio of 8:2) was plasma sprayed (by means of Metco thermal spraying machine) under an Ar gas sealed atmosphere to form a coating film having a thickness of 50 $\mu$m as an undercoat.

Further, a Mo metal powder having a thermal expansion coefficient close to the thermal expansion coefficient of $ZrB_2$ was plasma-sprayed under an Ar gas sealed atmosphere thereon to form a coating film having a thickness of 50 μm.

This plasma spraying under an Ar gas sealed atmosphere is conducted by enclosing a spray gun and the cylindrical target holder by a sealed box made of a metal and permitting an Ar gas flow therein in a spiral fashion, whereby the Ar gas was used as the plasma gas at a flow rate of 42.5 l/min, and a powder of 700 A.35 kV was applied, and the alloy powder of Ni—Al (weight ratio of 8:2) and the Mo metal powder were instantaneously heated by the Ar gas plasma of from 10,000° to 20,000° C., transported together with the gas to the target holder and condensed thereon. The undercoat was formed by laterally reciprocating the plasma spray gun many times while rotating the target holder by the lathe.

Then, using the above-mentioned $ZrB_2$ powder, plasma spraying was conducted in a similar manner to obtain a rotatable magnetron sputtering cathode target having $ZrB_2$ coated in a final thickness of 3 mm.

The ceramic target layer had a relative density of 90%. Further, the oxygen content in the ceramic layer was 1.1% by weight.

The rotatable cathode target of $ZrB_2$ thus obtained, was mounted on a magnetron sputtering apparatus, and a $ZrB_xO_y$ film (atomic ratio of Zr:B:O=1:2:5) was formed on a glass substrate. The sputtering was conducted in a vacuum of from $1\times10^{-3}$ to $1\times10^{-2}$ Torr in an atmosphere of a mixture of $Ar+O_2$ to obtain a transparent non-crystalline oxide film of 1,000 Å. The chemical compositional Zr/B ratio of this non-crystalline film was the same as the chemical compositional Zr/B ratio of the target.

The above target had better thermal shock resistance than a planar type target which was prepared by forming a ceramics by a conventional ceramic technique and bonding it to a target holder. With the target prepared by the conventional method, cracking occurs upon application of a sputtering power of about 2.5 kW and partial peeling takes place. Whereas, with the rotatable cathode target of the present invention, no cracking was observed at 5 kW, and film-forming was conducted under a stabilized condition without arcing, and a high film-forming speed of 100 Å/sec was obtained, which was about four times higher than the film-forming speed of 25 Å/sec by the conventional method.

EXAMPLE 5

Two Undercoat Layers, Ar Gas Plasma

A mixture comprising $ZrO_2$, $SiO_2$ and carbon powder, as a raw material for ceramic powder for thermal spraying, was reacted at a high temperature under a non-oxidizing atmosphere to obtain a bulky sintered product. This sintered product was pulverized and classified to obtain a $ZrSi_2$ powder having a purity of 99.5% and a particle size of from 20 to 75 μm. A rotatable target was prepared in the same manner as in Example 4 except that this powder was used instead of the $ZrB_2$ powder and a Ti metal powder was used instead of the Mo metal powder. The relative density of the formed ceramic layer was 92%, and the oxygen content was 0.9% by weight.

Using the rotatable target, film-forming was conducted by a magnetron sputtering apparatus. As a result, a transparent thin film of $ZrSi_xO_y$ (atomic ratio of Zr:Si:O=1:2:6) having a thickness of 1,000 Å, was obtained. Like the case of the $ZrB_2$ target in Example 4, no change was observed in the chemical composition of the target, and a film-forming speed of about 4 times higher than the planar type target prepared by the conventional ceramic technique, was obtained, and no damage was observed even when the applied power was increased.

EXAMPLE 6

Two Undercoat Layers, Ar Gas Plasma)

A mixture comprising $ZrO_2$, $SiO_2$, $B_2O_3$ and carbon powder, as a raw material for thermal spraying, was reacted at a high temperature under a non-oxidizing atmosphere to obtain a bulky sintered product. This sintered product was pulverized and classified to obtain a powder of Zr—B—Si (atomic ratio of 1:1:8) having a purity of 99.5% and a particle size of from 20 to 75 μm. A rotatable target was prepared in the same manner as in Example 4 except that this powder was used. The relative density of the formed ceramic layer was 91.5%, and the oxygen content was 0.85% by weight.

Using this rotatable target, film-forming was conducted by a sputtering apparatus. As a result, a transparent thin film of $ZrB_xSi_yO_z$ (atomic ratio of Zr:B:Si:O=1:1:8:18.5) having a thickness of 1,000 Å, was obtained. Like the cases of the $ZrB_2$ and $ZrSi_2$ targets in Examples 4 and 5, no change was observed in the chemical composition of the target, and a film-forming speed of about 3.5 times higher than the planar type target prepared by the conventional ceramic technique, was obtained, and no cracking or damage was observed even when the applied power was increased, and the film-forming was conducted at a high speed under a stabilized condition.

EXAMPLE 7

Two Undercoat Layers, Reduced Pressure Ar Gas Plasma

A mixture comprising $ZrO_2$, $B_2O_3$ and carbon, as a raw material for ceramic powder for thermal spraying, was reacted at a high temperature under a non-oxidizing atmosphere to obtain a bulky sintered product. This sintered product was pulverized and classified to obtain a $ZrB_2$ powder having a purity of 99.5% and a particle size of from 20 to 45 μm.

A cylindrical target holder made of copper having an inner diameter of 50.5 mm, an outer diameter of 67.5 mm and a length of 406 mm, was attached to a lathe, and its outer surface was threaded and further sandblasted by abrasive particles to form a roughened surface. Then, an alloy powder of Ni—Al (weight ratio of 8:2) was plasma-sprayed under reduced pressure to form a covering film having a thickness of 50 μm as an undercoat. Further, a Mo metal powder having a thermal expansion coefficient close to the thermal expansion coefficient of $ZrB_2$ was plasma-sprayed under reduced pressure to form a coating film having a thickness of 50 μm thereon.

These plasma spraying operations under reduced pressure were conducted in such a manner that thermal spraying was conducted under a non-oxidizing atmosphere prepared by vacuuming the plasma spraying machine to a level of from 50 to 300 Torr in a vacuum chamber and introducing an Ar gas into this chamber, whereby the Ar gas was used as a plasma gas at a flow rate of 42.5 l/min, and a power of 700 A.35 kV was applied, and the alloy powder of Ni—Al (weight ratio of 8:2) and the Mo metal powder were instantaneously heated by the Ar gas plasma of from 10,000° to 20,000° C. and transported together with the gas to the target holder and condensed thereon. The undercoat was formed by laterally reciprocating the reduced pressure plasma spray gun many times while rotating the target holder by the lathe.

Then, using the above-mentioned $ZrB_2$ powder, reduced pressure plasma spraying was conducted in a similar manner to obtain a rotatable cathode target having $ZrB_2$ coated in a final thickness of 3 mm. The relative density of this ceramic layer was as high as 98%. The oxygen content in this ceramic layer was 0.2% by weight, and thus no oxidation was observed.

The rotatable cathode target made of $ZrB_2$ thus obtained, was mounted on a magnetron sputtering apparatus, and a $ZrB_xO_y$ film (atomic ratio of Zr:B:O=1:2:5) was formed on a glass substrate. The sputtering was conducted in a vacuum at a level of from $1 \times 10^{-3}$ to $1 \times 10^{-2}$ Torr in an atmosphere of a mixture of $Ar+O_2$, to obtain a transparent non-crystalline oxide film having a thickness of 1,000 Å. The chemical compositional Zr/B ratio by atomic % in this non-crystalline film was the same as the chemical compositional Zr/B ratio in the target.

The above target had better thermal shock resistance than a planar type target prepared by forming a ceramic compact by a conventional ceramic technique and bonding it to a target holder. With the target prepared by the conventional method, cracking occurs at a sputtering power of about 1.5 kW, and partial peeling takes place. Whereas, with the rotatable cathode target of the present invention, no cracking was observed at 5 kW, and film-forming was conducted under a stabilized condition without arcing, and a high film-forming speed of 100 Å/sec was obtained, which was about 4 times higher than the film-forming speed of 25 Å/sec by the conventional method.

EXAMPLE 8

Two undercoat layers, Ar Gas Plasma Under Reduced Pressure

A mixture comprising $ZrO_2$, $SiO_2$ and carbon powder, as a raw material for ceramic powder for thermal spraying, was reacted at a temperature under a non-oxidizing atmosphere to obtain a bulky sintered product. This sintered product was pulverized and classified to obtain a $ZrSi_2$ powder having a purity of 99.5% and a particle size of from 20 to 75 μm. A rotatable target was prepared in the same manner as in Example 7 except that this powder was used instead of the $ZrB_2$ powder, and a Ti metal powder was used instead of the Mo metal powder. The relative density of the formed ceramic layer was 8.5%, and the oxygen content was 0.25% by weight.

Using this rotatable target, film-forming was conducted by a magnetron sputtering apparatus. As a result, a transparent thin film of $ZrSi_xO_y$ (atomic ratio of Zr:Si:O=1:2:6) having a thickness of 1,000 Å was obtained. Like the case of the $ZrB_2$ target in Example 7, no change was observed in the chemical composition of the target, and a film-forming speed of about 4 times higher than the planar type target prepared by the conventional ceramic technique, was obtained, and no damage was observed even when the applied power was increased.

EXAMPLE 9

A mixture comprising $ZrO_2$, $SiO_2$, $B_2O_3$ and carbon powder, as a raw material for thermal spraying, was reacted at a high temperature under a non-oxidizing atmosphere to obtain a bulky sintered product. This sintered product was pulverized and classified to obtain a powder of Zr—B—Si (atomic ratio of 1:1:8) having a purity of 99.5% and a particle size of from 20 to 75 μm. A rotatable target was prepared in the same manner as in Example 7 except that this powder was used. The relative density of the formed ceramics layer was 98.5%, and the oxygen content was 0.15% by weight. Using this rotatable target, film-forming was conducted by a sputtering apparatus. As a result, a transparent thin film of $ZrB_xSi_yO_z$ (atomic ratio of Zr:B:Si:O=1:1:8:18.5) having a thickness of 1,000 Å, was obtained.

Like the cases of the $ZrB_2$ and $ZrSi_2$ targets in Examples 7 and 8, no change was observed in the chemical composition of the target, and a film-forming speed of about 3.5 times higher than the planar type target prepared by the conventional ceramic technique, was obtained, and no cracking or damage was observed even when the applied power was increased, and film-forming was conducted at a high speed under a stabilized condition.

EXAMPLE 10

Two Undercoat Layers, HIP Treatment

A mixture comprising $ZrO_2$, $B_2O_3$ and carbon, as a raw material for ceramic powder, was reacted at a high temperature in a non-oxidizing atmosphere to obtain a bulky sintered product. This sintered product was pulverized in a nylon pot mill in an ethanol solvent using $ZrO_2$ (partially stabilized $ZrO_2$) balls for 24 hours. To the obtained sludge, a binder of a vinyl acetate-acrylate copolymer was added and mixed, and the mixture was dried by an explosion-proof spray drier to obtain a $ZrB_2$ granulated powder having a purity of 99.5% and an average particle size of 80 μm.

A cylindrical target holder made of copper having an outer diameter of 67.5 mm and a length of 406 mm, was attached to a lathe, and its outer surface was threaded and further sand-blasted by abrasive particles to form a roughened surface. Then, a alloy powder of Ni—Al (weight ratio of 8:2) for the first layer and a metal powder of Mo for the second layer were, respectively, plasma-sprayed (by means of Metco thermal spraying machine) in an Ar gas atmosphere to form coating films each having a thickness of 50 μm, as an undercoat.

This surface-treated cylindrical target holder was placed in a stainless steel capsule for HIP treatment having an $Al_2O_3$ fiber paper (1 mm in thickness) preliminarily bonded to its inner surface, and its bottom was welded to obtain a capsule for HIP treatment. The above-mentioned $ZrB_2$ granulated powder was packed under vibration by means of a vibrator into a space between the capsule and the cylindrical target holder. Then, the interior of this stainless steel capsule was evacuated to a reduced pressure of at most $10^{-3}$ mmHg and sealed, and the capsule was inserted into an apparatus for HIP treatment, followed by HIP treatment.

HIP treatment was conducted for one hour at a temperature of 1,130° C. using Ar gas (purity: 99.9%) under a pressure of 200 MPa, as a pressure medium. After the HIP treatment, the stainless steel capsule was taken off and the outer surface of the cylindrical target of $ZrB_2$ ceramic was processed to be smooth, and the inner surface of the target holder was processed by a lathe to have an inner diameter of 50.5 mm, to obtain a rotatable cathode target having a $ZrB_2$ ceramic of 5 mm having the $ZrB_2$ ceramic and the target holder firmly bonded integrally.

The relative density of the $ZrB_2$ ceramic layer thus obtained was 99.5%, and the oxygen content in the ceramics layer was 0.15% by weight.

The $ZrB_2$ rotatable cathode target thus obtained, was mounted on a magnetron sputtering apparatus, and a $ZrB_xO_y$ film (atomic ratio of Zr:B:O=1:2:5) was formed on a glass substrate. Sputtering was conducted in a vacuum at a level of from $1 \times 10^{-3}$ to $1 \times 10^{-2}$ Torr in an atmosphere of a mixture of $Ar+O_2$ to obtain a transparent non-crystalline oxide film having a thickness of 1,000 Å. The chemical compositional Zr/B atomic ratio of this non-crystalline film was the same as the chemical compositional Zr/B ratio of the target.

The above target had better thermal shock resistance than a planar type target prepared by forming a ceramic compact by a conventional ceramic technique and bonding it to a target holder. With the target prepared by the conventional method, cracking occurs and partial peeling takes place at a sputtering power of 2.5 kW. Whereas, with the rotatable cathode target of the present invention, no cracking was observed even at 5 kW, and the film-forming was conducted under a stabilized condition without arcing, and a high film-forming speed of 100 Å/sec was obtained, which was about four times higher than the film-forming speed of 25 Å/sec by the conventional method.

EXAMPLE 11

Two Undercoat Layers, HIP Treatment

A mixture comprising $ZrO_2$, $SiO_2$ and carbon powder, as a raw material for ceramic powder, was reacted at a high temperature in a non-oxidizing atmosphere to obtain a bulky sintered product. This sintered product was pulverized and classified in the same manner as in Example 10 to obtain a $ZrSi_2$ powder having a purity of 99.5% and an average particle size of 80 μm. A rotatable target was prepared in the same manner as in Example 10 except that this powder was used instead of the $ZrB_2$ powder, and a Ti metal powder was used instead of the Mo metal powder. The relative density of the $ZrSi_2$ ceramic layer was 99.5%, and the oxygen content was 0.2% by weight.

Using this rotatable target, film-forming was conducted by a magnetron sputtering apparatus. As a result, a transparent thin film of $ZrSi_xO_y$ (atomic ratio of Zr:Si:O=1:2:6) having a thickness of 1,000 Å, was obtained. Like the case of the $ZrB_2$ target in Example 10, no change was observed in the chemical composition of the target, and a film-forming speed of about 4 times higher than the planar type target prepared by the conventional ceramic technique, was obtained, and no damage was observed even when the applied power was increased.

EXAMPLE 12

Two Undercoat Layers, HIP Treatment

A mixture comprising $ZrO_2$, $SiO_2$, $B_2O_3$ and carbon powder, as a raw material for ceramic powder, was reacted at a high temperature in a non-oxidizing atmosphere to obtain a bulky sintered product. This sintered product was pulverized and granulated in the same manner as in Example 10 to obtain a powder of Zr—B—Si (atomic ratio of 1:1:8) having a purity of 99.5% and an average particle size of 80 μm. A rotatable target was prepared in the same manner as in Example 10 except that this powder was used. The relative density of the $ZrBSi_8$ ceramic layer was 99.5%, and the oxygen content was 0.13% by weight. Using this rotatable target, film-forming was conducted by a sputtering apparatus.

As a result, a transparent thin film of $ZrB_xSi_yO_z$ (atomic ratio of Zr:B:Si:O=1:1:8:18.5) having a thickness of 1,000 Å, was obtained. Like the cases of the $ZrB_2$ and $ZrSi_2$ targets in Examples 10 and 11, no change was observed in the chemical composition of the target, and a film-forming speed of about 3.5 times higher than the planar type target prepared by the conventional ceramic technique, was obtained, and no cracking or damage was observed even when the applied power was increased, and film-forming was conducted at a high speed under a stabilized condition.

EXAMPLE 13

Two Undercoat Layers, Plasma Spraying In Atmospheric Air

A $ZrB_2$ powder having a purity of 99.5% and a particle size of from 20 to 45 μm, was used as a raw material for ceramic powder for thermal spraying. A cylindrical target holder made of copper having an inner diameter of 50.5 mm, an outer diameter of 67.5 mm and a length of 406 mm, was attached to a lathe, and its outer surface was threaded and further sand-blasted by $Al_2O_3$ abrasive particles to obtain a roughened surface.

Then, an alloy powder of Ni—Al (weight ratio of 8:2) was plasma-sprayed in atmospheric air to form a coating film having a thickness of 50 μm, as an undercoat. Further, a Mo metal powder was plasma-sprayed thereon to form a coating film having a thickness of 50 μm. Then, the above-mentioned $ZrB_2$ powder was plasma-sprayed thereon in atmospheric air in the same manner to obtain a rotatable cathode target having $ZrB_2$ coated in a final thickness of 3 mm. The relative density of the ceramic layer thus obtained was 88%, and the oxygen content was 3.05% by weight.

The $ZrB_2$ rotatable cathode target thus obtained, was mounted on a magnetron sputtering apparatus, and a $ZrB_xO_y$ film was formed on a glass substrate to obtain a transparent non-crystalline oxide film having a thickness of 1,000 Å. The chemical compositional ZrB atomic ratio of this non-crystalline film was such that B was less than in the chemical composition of the ceramic layer.

In the sputtering, arcing was rather vigorous at the initial stage, and presputtering for about 30 minutes was necessary. By high speed film-forming at 5 kW, a film-forming speed of 100 Å/sec which was about four times higher than the conventional speed, was obtained although arcing occurred to a small extent. No cracking or peeling of the target ceramic layer was observed during the sputtering. However, on the surface of the target, fine arcing spots were formed to some extent.

Now, Examples for the production of targets useful for forming transparent oxide films having low refractive indices will be described.

EXAMPLE 14

One Undercoat Layer, Ar Gas Plasma

A mixture comprising $ZrO_2$, $SiO_2$ and carbon, as a raw material for ceramic powder for thermal spraying, was reacted at a high temperature in a non-oxidizing atmosphere to obtain a bulky sintered product. This sintered product was pulverized and classified to obtain a powder of Si—Zr (atomic ratio of Si:Zr=9:1) having a purity of 99.5% and a particle size of from 20 to 75 μm.

A cylindrical target holder made of copper having an inner diameter of 50.5 mm, an outer diameter of 67.5 mm and a length of 406 mm, was attached to a lathe, and its outer surface was sand-blasted by $Al_2O_3$ abrasive particles to obtain a roughened surface. Then, an alloy powder of Ni—Al (9:1) was plasma-sprayed (by means of Metco thermal spraying machine) to form a coating film having a thickness of 50 μm, as an undercoat. This plasma spraying was conducted using Ar gas as the plasma gas at a flow rate of 42.5 l/min by applying a power of 700 A.35 kV, whereby the alloy powder of Ni—Al (9:1) was instantaneously heated by the Ar gas plasma at a temperature of from 10,000° to 20,000° C. and transported together with the gas to the target holder and condensed thereon. The undercoat was formed by laterally reciprocating a plasma spray gun many times while rotating the target holder by a lathe.

Then, using the above-mentioned Si—Zr powder, plasma spraying was conducted in a similar manner to obtain a rotatable cathode target having Si—Zr (atomic ratio of Si:Zr=9:1) coated in a final thickness of 3 mm. The rotatable cathode target of Si—Zr thus obtained was mounted on a magnetron sputtering apparatus, and a $SiZr_xO_y$ film (atomic ratio of Si:Zr:O=9:1:20) was formed on a glass substrate. The sputtering was conducted under a vacuum at a level of from $1 \times 10^{-3}$ to $1 \times 10^{-2}$ Torr in an atmosphere of a mixture of $Ar + O_2$, to obtain a transparent oxide film of 1,000 Å having a low refractive index.

The above target had better thermal shock resistance than a planar type target which was prepared by molding a ceramic by a conventional ceramic technique and bonding it to a target holder. With the target prepared by the conventional method, cracking occurs and partial peeling takes place upon application of a sputtering power of about 1.2 kW. Whereas, with the rotatable cathode target of the present invention, no cracking was observed even at 4 kW, and film-forming was conducted under a stabilized condition without arcing, and a high film-forming speed of 100 Å/sec was obtained, which was about 4 times higher than the film-forming speed of 25 Å/sec by the conventional method.

The refractive index of the obtained oxide film was as low as 1.49, and the film was excellent also in alkali resistance.

COMPARATIVE EXAMPLE 1

A Si powder was plasma-sprayed in the same manner as in Example 14 to obtain a rotatable cathode target. Film-forming was conducted under the same sputtering conditions, but arcing was vigorous, and it was impossible to form a film under a stabilized condition.

Comparison between Example 14 and Comparative Example 1 is shown in Table 1. The alkali resistance of the film shown in Table 1 is the result when the sample was immersed in 0.1N NaOH at room temperature for 240 hours, whereby ○ indicates a case where the change in the film thickness relative to the thickness prior to the immersion is within 10%, and × indicates a case where the film was dissolved.

TABLE 1

| | Composition of the target | Type of the target | Film-forming stability | Film-forming speed (Å/sec) | Refractive index of the film | Alkali resistance of the film |
|---|---|---|---|---|---|---|
| Example 14 | 90 Si-10 Zr | Rotatable cathode | Good | 100 | 1.49 | ○ |
| Comparative Example 1 | Si | Rotatable cathode | Arcing occurred | 5 | 1.46 | × |

EXAMPLE 15

TWO Undercoat Layers, Ar Gas Plasma

A mixture comprising $ZrO_2$, $SiO_2$ and carbon, as a raw material for ceramic powder for thermal spraying, was reacted at a high temperature in a non-oxidizing atmosphere to obtain a bulky sintered product. This sintered product was pulverized and classified to obtain a powder of Si—Zr (atomic ratio of Si:Zr=9:1) having a purity of 99.5% and a particle size of from 20 to 75 μm.

A cylindrical target holder made of copper having an inner diameter of 50.5 mm, an outer diameter of 67.5 mm and a length of 406 mm, was attached to a lathe, and its outer surface was threaded and further sand-blasted by $Al_2O_3$ abrasive particles to obtain a roughened surface. Then, an alloy powder of Ni-Al (weight ratio of 8:2) was plasma-sprayed (by means of Metco thermal spraying machine) under an argon gas sealed atmosphere to form a coating film having a thickness of 50 μm, as an undercoat.

Further, a Mo metal powder having a thermal expansion coefficient approximating to the thermal expansion coefficient of the ceramic layer of Si—Zr (atomic ratio of Si:Zr=9:1), was plasma-sprayed thereon under an argon gas sealed atmosphere to form a coating film having a thickness of 50 μm. This plasma spraying under an argon gas sealed atmosphere is conducted by enclosing a spray gun and the cylindrical target holder by a sealed box made of a metal and permitting an argon gas flow therein in a spiral fashion, whereby the argon gas was used as the plasma gas at a flow rate of 42.5 l/min, and a power of 700 A.35 kV was applied, and the alloy powder of Ni—Al (weight ratio of 8:2) and the Mo metal powder were instantaneously heated by the argon gas plasma of from 10,000° to 20,000° C., transported together with the gas to the target holder and condensed thereon. The undercoat was formed by laterally reciprocating the plasma spray gun many times while rotating the target holder by the lathe.

Then, using the above-mentioned Si—Zr powder, plasma spraying was conducted in a similar manner to obtain a rotatable cathode target having Si—Zr (atomic ratio of Si:Zr=9:1) coated in a final thickness of 3 mm. The relative density of this ceramic target layer was 91%, and the oxygen content was 1.0% by weight.

The rotatable cathode target of Si—Zr thus obtained, was mounted on a magnetron sputtering apparatus, and a $SiZr_xO_y$ film (atomic ratio of Si:Zr:O=9:1:20) was formed on a glass substrate. The sputtering was conducted in a vacuum of from $1\times10^{-3}$ to $1\times10^{-2}$ Torr in an atmosphere of a mixture of $Ar+O_2$, to obtain a transparent oxide film of 100 Å having a low refractive index. The chemical compositional Si/Zr atomic ratio of this low refractive index transparent oxide film was the same as the chemical compositional Si/Zr ratio of the target.

The above target had better thermal shock resistance than a planar type target which was prepared by forming a ceramics by a conventional ceramic technique and bonding it to a target holder. With the target prepared by the conventional method, cracking occurs and partial peeling takes place upon application of a sputtering power of about 1.2 kW. Whereas, with the rotatable cathode target of the present invention, no cracking was observed even at 4 kW, and film-forming was conducted under a stabilized condition without arcing, and a high film-forming speed of 100 Å/sec was obtained, which was about 4 times higher than the film-forming speed of 25 Å/sec by the conventional method.

The refractive index of the obtained oxide film was as low as 1.49, and the film was excellent also in alkali resistance.

EXAMPLES 16 TO 22

Various targets were prepared in the same manner as in Example 15 except that the substances constituting the targets and their proportions were changed. Using such targets, film-forming was conducted by sputtering in the same manner as in Example 15. However, in Examples 16 and 20, a Ti metal powder was used instead of the Mo metal powder, and the undercoat was two layers of Ni—Al (50 μm)/Ti (50 μm). Further, in Example 19, the undercoat was a single layer of Ni-Al (100 μm). In Examples 17, 18, 21 and 22, the same undercoat as in Example 15 was formed. In each case, the method for forming the undercoat was the same as in Example 15.

COMPARATIVE EXAMPLE 2

A rotatable cathode was prepared in the same manner as in Example 15 except that the ceramic layer as a target was formed by using a Si powder. Film-forming was conducted under the same sputtering conditions, but arcing was vigorous, and it was impossible to form a film under a stabilized condition.

COMPARATIVE EXAMPLE 3

A rotatable cathode target was prepared in the same manner as in Example 15 except that using the same Si—Zr (atomic ratio of Si:Zr=9:1) powder as in Example 15, the ceramics layer as a target was formed by plasma spraying in atmospheric air. The relative density of this ceramic target layer was 89%, and the oxygen content was 3.1% by weight.

Using this target, film-forming was conducted by sputtering in the same manner as in Example 15. In the sputtering, arcing was vigorous at the initial stage, and presputtering for about 40 minutes was necessary. At high-speed film-forming at 4 kW, a film-forming speed of about 4 times higher than the conventional speed was obtained although arcing occurred to a small extent. No cracking or peeling of the ceramic layer of the target was observed during the sputtering, but on the target surface, fine arcing spots were formed to some extent.

Comparison between Examples 15 to 22 and Comparative Examples 2 and 3 is shown in Table 2. The alkali resistance of the film shown in Table 2 is the result where a sample was immersed in 0.1N NaOH at room temperature for 240 hours, whereby ◯ indicates that the change in the film thickness relative to the thickness prior to the immersion is within 10%, and × indicates that the film was dissolved.

TABLE 2

|  | Composition of the target | Film-forming stability | Film-forming speed (Å/sec) | Refractive index of the film | Alkali resistance of the film |
| --- | --- | --- | --- | --- | --- |
| Example 15 | 90 Si–10 Zr | Good | 100 | 1.49 | ◯ |
| Example 16 | 67 Si–33 Zr | Good | 130 | 1.74 | ◯ |
| Example 17 | 80 Si–20 Zr | Good | 110 | 1.57 | ◯ |
| Example 18 | 95 Si–5 Zr | Good | 80 | 1.47 | ◯ |
| Example 19 | 67 Si–33 Ti | Good | 125 | 1.66 | ◯ |
| Example 20 | 90 Si–10 Ti | Good | 96 | 1.51 | ◯ |
| Example 21 | 67 Si–33 Hf | Good | 120 | 1.75 | ◯ |
| Example 22 | 90 Si–10 Hf | Good | 90 | 1.49 | ◯ |
| Comparative Example 2 | Si | Arcing occured | 5 | 1.46 | × |
| Comparative Example 3 | 90 Si–10 Zr | Arcing occured at the initial stage, and arcing occured to a small extent subsequently | 100 | 1.49 | ◯ |

Type of targets:
In Examples 15 to 22 and Comparative Examples 2 and 3, targets were of a rotatable cathode type.

EXAMPLE 23

TWO Undercoat Layers, Reduced Pressure Ar Gas Plasma

A mixture comprising $ZrO_2$, $SiO_2$ and carbon, as a raw material for ceramic powder for thermal spraying, was reacted at a high temperature in a non-oxidizing atmosphere to obtain a bulky sintered product. This sintered product was pulverized and classified to obtain a powder of Si—Zr (atomic ratio of Si:Zr=9:1) having a purity of 99.5% and a particle size of from 20 to 75 μm.

A cylindrical target holder made of copper having an inner diameter of 50.5 mm, an outer diameter of 67.5 mm and a length of 406 mm, was attached to a lathe, and its outer surface was threaded and further sand-blasted by $Al_2O_3$ abrasive particles to obtain a roughened surface. Then, an alloy powder of Ni—Al (weight ratio of 8:2) was plasma-sprayed under reduced pressure to form a coating film having a thickness of 50 μm, as an undercoat. Further, a Mo metal powder having a thermal expansion coefficient approximating to the thermal expansion coefficient of the ceramics layer of Si—Zr (atomic ratio of Si:Zr=9:1), was plasma-sprayed under reduced pressure thereon to form a coating film having a thickness of 50 μm.

This plasma spraying under reduced pressure was conducted in such a manner that thermal spraying was conducted under a non-oxidizing atmosphere prepared by vacuuming the plasma spraying machine to a level of from 50 to 300 Torr in a vacuum chamber and introducing an Ar gas into this chamber, whereby the Ar gas was used as a plasma gas at a flow rate of 42.5 l/min, and a power of 700 A.35 kV was applied, and the alloy powder of Ni—Al (weight ratio of 8:2) and the Mo metal powder were instantaneously heated by the Ar gas plasma of from 10,000° to 20,000° C. and transported together with the gas to the target holder and condensed thereon. The undercoat was formed by laterally reciprocating the reduced pressure plasma spray gun many times while rotating the target holder by the lathe.

Then, using the above-mentioned Si—Zr powder, plasma spraying was conducted in a similar manner to obtain a rotatable cathode target having Si—Zr (atomic ratio of Si:Zr=9:1) coated in a final thickness of 3 mm. The relative density of this ceramics target layer was 98.3%, and the oxygen content was 0.21% by weight.

The rotatable cathode target of Si—Zr thus obtained, was mounted on a magnetron sputtering apparatus, and a $SiZr_xO_y$ film (atomic ratio of Si:Zr:O=9:1:20) was formed on a glass substrate. The sputtering was conducted in a vacuum at a level of from $1 \times 10^{-3}$ to $1 \times 10^{-2}$ Torr in an atmosphere of a mixture of Ar+$O_2$, to obtain a transparent oxide film of 1,000 Å having a low refractive index. The chemical compositional Si/Zr atomic ratio of this low refractive index transparent oxide film was the same as the chemical compositional Si/Zr ratio of the target.

The above target had better thermal shock resistance than a planar type target prepared by forming a ceramic compact by a conventional ceramic technique and bonding it to a target holder. With the target prepared by the conventional method, cracking occurs and partial peeling takes place at a sputtering power of about 1.2 kW. Whereas, with the rotatable cathode target of the present invention, no cracking was observed even at 4 kW, and film-forming was conducted under a stabilized condition without arcing, and a high film-forming speed of 100 Å/sec was obtained, which was about 4 times higher than the film-forming speed of 25 Å/sec by the conventional method.

The refractive index of the oxide film thus obtained was as low as 1.49, and the film was excellent also in the alkali resistance.

EXAMPLES 24 TO 30

Various targets were prepared in the same manner as in Example 23 by changing the substances constituting the targets and their proportions. Using such targets, film-forming was conducted by sputtering in the same manner as in Example 23.

However, in Examples 24 and 28, a Ti metal powder was used instead of the Mo metal powder, and the undercoat was two layers of Ni—Al (50 μm)/Ti (50 μm). Further, in Example 27, the undercoat was a single layer of Ni—Al (100 μm). In Examples 25, 26, 29 and 30, the same undercoat as in Example 23 was formed. In each case, the undercoat was formed in the same manner as in Example 23.

COMPARATIVE EXAMPLE 4

A rotatable cathode target was prepared in the same manner as in Example 23 except that the ceramic layer as the target was formed with a Si powder. Film-forming was conducted under the same sputtering conditions, but arcing was vigorous, and it was impossible to form a film under a stabilized condition.

COMPARATIVE EXAMPLE 5

A rotatable cathode target was prepared in the same manner as in Example 23 except that using the same Si—Zr (atomic ratio of Si:Zr=9:1) powder as in Example 23, a ceramics layer as a target was formed by plasma spraying in atmospheric air. The relative density of this ceramic target layer was 89%, and the oxygen content was 3.1% by weight.

Using this target, film-forming was conducted by sputtering in the same manner as in Example 23. In the sputtering, arcing was vigorous in the initial stage, and presputtering for about 40 minutes was necessary. At high speed film-forming at 4 kW, a film-forming speed of four times higher than the conventional speed was obtained although arcing occurred to a small extent. No cracking or peeling of the ceramics layer as the target was observed during the sputtering, but on the target surface, fine arcing spots were formed to some extent.

Comparison between Examples 23 to 30 and Comparative Examples 4 and 5 is shown in Table 3. The alkali resistance of the film shown in Table 3 is the result where a sample was immersed in 0.1N NaOH at room temperature for 240 hours, whereby ◯ indicates that the change in the film thickness relative to the thickness prior to the immersion was within 10%, and × indicates that the film was dissolved.

TABLE 3

|  | Composition of the target | Type of the target | Film-forming stability | Film-forming speed (Å/sec) | Refractive index of the film | Alkali resistance of the film |
|---|---|---|---|---|---|---|
| Example 23 | 90 Si–10 Zr | Rotatable cathode | Good | 100 | 1.49 | ◯ |
| Example 24 | 67 Si–33 Zr | Rotatable cathode | Good | 130 | 1.74 | ◯ |
| Example 25 | 80 Si–20 Zr | Rotatable cathode | Good | 110 | 1.57 | ◯ |
| Example 26 | 95 Si–5 Zr | Rotatable cathode | Good | 80 | 1.47 | ◯ |
| Example 27 | 67 Si–33 Ti | Rotatable cathode | Good | 125 | 1.66 | ◯ |
| Example 28 | 90 Si–10 Ti | Rotatable cathode | Good | 96 | 1.51 | ◯ |
| Example 29 | 67 Si–33 Hf | Rotatable cathode | Good | 120 | 1.75 | ◯ |
| Example 30 | 90 Si–10 Hf | Rotatable cathode | Good | 90 | 1.49 | ◯ |
| Comparative Example 4 | Si | Rotatable cathode | Arcing occurred | 5 | 1.46 | × |
| Comparative | 90 Si–10 Zr | Rotatable cathode | 1* | 100 | 1.49 | ◯ |

TABLE 3-continued

| Composition of the target | Type of the target | Film-forming stability | Film-forming speed (Å/sec) | Refractive index of the film | Alkali resistance of the film |
|---|---|---|---|---|---|
| Example 5 | | | | | |

1* Arcing occurred at the initial stage, and arcing occurred to a small extent subsequently.

EXAMPLE 31

Two Undercoat Layers, HIP Treatment

A mixture comprising $ZrO_2$, $SiO_2$ and carbon, as a raw material for ceramics powder, was reacted at a high temperature in a non-oxidizing atmosphere to obtain a bulky sintered product. This sintered product was pulverized in a nylon pot mill in an ethanol solvent using $ZrO_2$ (partially stabilized $ZrO_2$) balls for 24 hours. To the sludge thereby obtained, a binder of a vinyl acetate-acrylate copolymer was added and mixed, and then the mixture was dried by an explosion-proof spray drier to obtain a granulated powder of Si—Zr (atomic ratio of Si:Zr=9:1) having a purity of 99.5% and an average particle size of 80 μm.

A cylindrical target holder made of copper having an outer diameter of 67.5 mm and a length of 406 mm, was attached to a lathe, and the outer surface was threaded and further sand-blasted by $Al_2O_3$ abrasive particles to obtain a roughened surface.

Then, an alloy powder of Ni—Al (weight ratio of 8:2) for a first layer and a metal powder of Ti for a second layer were plasma-sprayed (by means of Metco thermal spraying machine) in an Ar gas atmosphere to form coating films each having a thickness of 50 μm, as an undercoat.

The cylindrical target holder having the surface treatment thus applied, was placed in a stainless steel capsule for HIP treatment having an $Al_2O_3$ fiber paper (1 mm in thickness) preliminarily bonded to its inner surface, and the bottom thereof was welded to obtain a capsule for HIP treatment. The above-mentioned Si—Zr granulated powder was packed under vibration by a vibrator in a space between this capsule and the cylindrical target holder. The interior of this stainless steel capsule was evacuated to a reduced pressure of not higher than $10^{-3}$ mmHg and sealed, and the capsule was inserted in a HIP treatment apparatus, followed by HIP treatment.

HIP treatment was conducted for one hour by using, as a pressure medium, an Ar gas (purity: 99.9%) under a pressure of 200 MPa at a temperature of 1,000° C. After the HIP treatment, the stainless steel capsule was taken off, and the outer surface of the Si—Zr ceramic cylindrical target was processed to be smooth, and the inner surface of the target holder was processed to have an inner diameter of 50.5 mm, to obtain a rotatable cathode target having a Si—Zr (atomic ratio of Si:Zr=9:1) ceramic layer of 5 mm wherein the Si—Zr ceramic and the target holder were firmly integrally bonded.

The relative density of the Si—Zr ceramic layer thus obtained was 99.5%, and the oxygen content in the ceramic layer was 0.18% by weight.

The rotatable cathode target of Si—Zr thus obtained was mounted on a magnetron sputtering apparatus, and a $SiZr_xO_y$ film (atomic ratio of Si:Zr:O=9:1:20) was formed on a glass substrate. The sputtering was conducted in a vacuum at a level of from $1\times10^{-3}$ to $1\times10^{-2}$ Torr in an atmosphere of a mixture of $Ar+O_2$ to obtain a transparent oxide of 1,000 Å having a low refractive index. The chemical compositional Si/Zr atomic ratio of this low refractive index transparent oxide film was the same as the chemical compositional Si/Zr atomic ratio of the target.

The above target had better thermal shock resistance than a planar type target prepared by forming a ceramic by a conventional ceramic technique and bonding it to a target holder. With the target prepared by the conventional method, cracking occurs and partial peeling takes places upon application of a sputtering power of about 1.2 kW. Whereas, with the rotatable cathode target of the present invention, no cracking was observed even at 4 kW, and the film-forming was conducted under a stabilized condition without arcing, and a high film-forming speed of 100 Å/sec was obtained, which was about four times higher than the film-forming speed of 25 Å/sec by the conventional method.

The refractive index of the obtained oxide film was as low as 1.49, and the film was excellent also in the alkali resistance.

EXAMPLES 32 TO 38

Various targets were prepared in the same manner as in Example 31 except that the substances constituting the targets and their proportions were changed. Using such targets, film-forming was conducted by sputtering in the same manner as in Example 31. The results are shown in Table 4.

However, in Examples 32 and 36, a Ti metal powder was used instead of the Mo metal powder, and the undercoat was two layers of Ni—Al (50 μm)/Ti (50 μm). In Example 35, the undercoat was a single layer of Ni—Al (100 μm). In Examples 33, 34, 37 and 38, the same undercoat as in Example 31 was formed. In each case, the undercoat was formed in the same manner as in Example 31.

COMPARATIVE EXAMPLE 6

A Si powder was pulverized and granulated in the same manner as in Example 31. Using this powder, a rotatable cathode target was prepared in the same manner as in Example 31. Film-forming was conducted under the same sputtering conditions, but arcing was vigorous, and it was impossible to form a film under a stabilized condition.

COMPARATIVE EXAMPLE 7

A rotatable cathode target was prepared in the same manner as in Example 31 except that a powder for thermal spraying having a purity of 99.5% and a particle size of from 20 to 75 μm obtained by pulverizing and classifying a Si—Zr (atomic ratio of Si:Zr=9:1) bulky powder prepared in the same manner as in Example 31, was used, and the undercoat and the ceramic layer as the target thereon were formed by plasma spraying in atmospheric air. The relative density of this ceramic target layer was 89%, and the oxygen content was 3.1% by weight.

Using this target, film-forming was conducted by sputtering in the same manner as in Example 31. In the sputtering, arcing was vigorous at the initial stage, and presputtering for about 40 minutes was necessary. At high speed film-forming at 4 kW, a film-forming speed of about 4 times higher than the conventional speed was obtained, although arcing occurred to a small extent. No cracking or peeling of the target ceramic layer was observed during the sputtering, but on the target surface, fine arcing spots were formed to some extent.

COMPARATIVE EXAMPLE 8

The same Si—Zr (atomic ratio of Si:Zr=9:1) powder as in Example 31 was subjected to hot pressing to obtain a sintered product, and it was bonded to a planar type backing plate using indium to obtain a planar type target. Using this target, sputtering was conducted, whereby cracking and partial peeling of the target occurred, and it was impossible to form a film under a stabilized condition.

Comparison between Examples 31 to 38 and Comparative Examples 6 to 8 is shown in Table 4.

The alkali resistance of the film shown in Table 4 is the result where a sample was immersed in 0.1N NaOH at room temperature for 240 hours, whereby ◯ indicates a case where the change in the film thickness relative to the thickness prior to the immersion was within 10%, and × indicates that the film was dissolved.

Further, when the present invention is applied to a conventional planar type target, bonding of the target to the target holder will be unnecessary, and the target can easily be prepared. Further, restoration of an eroded portion is possible.

When the rotatable cathode target of the present invention is used, the cooling efficiency is high during the sputtering, and the target is free from cracking or breakage even when the sputtering power is increased, whereby a high speed film-forming can be conducted at a low temperature under a stabilized condition, and the productivity of glass with a large area for buildings or automobiles will be remarkably improved, and the utilization efficiency of the target will be high. Thus, the industrial values of the rotatable cathode target of the present invention are substantial. The target for forming a highly durable non-crystalline oxide film of the present invention is capable of presenting a non-crystalline oxide film which has not only high durability but also a high degree of freedom for optical design capable of controlling the refractive index by adjusting the amount of B or Si to be incorporated.

Such a non-crystalline oxide film has high scratch resistance, high abrasion resistance and high chemical resistance and thus can be used widely as an overcoat of various products. For example, it is most suitable as the outermost layer for e.g. a heat radiation reflecting glass for buildings or vehicles, a protective plate for a read-out portion of a bar code reader, a reflection preventive

TABLE 4

| | Composition of the target | Type of the target | Film-forming stability | Film-forming speed (Å/sec) | Refractive index of the film | Alkali resistance of the film |
|---|---|---|---|---|---|---|
| Example 31 | 90 Si–10 Zr | Rotatable cathode | Good | 100 | 1.49 | ◯ |
| Example 32 | 67 Si–33 Zr | Rotatable cathode | Good | 130 | 1.74 | ◯ |
| Example 33 | 80 Si–20 Zr | Rotatable cathode | Good | 110 | 1.57 | ◯ |
| Example 34 | 95 Si–5 Zr | Rotatable cathode | Good | 80 | 1.47 | ◯ |
| Example 35 | 67 Si–33 Ti | Rotatable cathode | Good | 125 | 1.66 | ◯ |
| Example 36 | 90 Si–10 Ti | Rotatable cathode | Good | 96 | 1.51 | ◯ |
| Example 37 | 67 Si–33 Hf | Rotatable cathode | Good | 120 | 1.75 | ◯ |
| Example 38 | 90 Si–10 Hf | Rotatable cathode | Good | 90 | 1.49 | ◯ |
| Comparative Example 6 | Si | Rotatable cathode | Arcing occurred | 5 | 1.46 | × |
| Comparative Example 7 | 90 Si–10 Zr | Rotatable cathode | Arcing occurred at the initial stage, and arcing occurred to a small extent subsequently | 100 | 1.49 | ◯ |
| Comparative Example 8 | 90 Si–10 Zr | Planar type | Cracking and partial peeling of the target | 25 | 1.49 | ◯ |

According to the present invention, the target is prepared by means of a spraying method or a HIP method, whereby a conventional installation for the production of ceramics is not required, and the target can easily be prepared at a low cost in a short period of time without requiring steps for processing and bonding. Further, the processes of the present invention can be applied to various inorganic materials. A high melting point material or a high melting point metal which is hardly made into a ceramic, is inexpensive in the form of a powder, and the present invention is particularly effective to prepare a target from such a material.

When a ceramic layer is formed in a non-oxidizing atmosphere or a reduced pressure non-oxidizing atmosphere by the first process of the present invention, or when the second process of the present invention is used, even if the target is made of a metal susceptible to oxidation or of a compound of at least two component system, a homogeneous target can be formed without no substantial change in the chemical composition.

film, or lenses for eye glasses. Further, it can be used widely for machine elements and can be used as a coating material for sliding parts.

By using a rotatable cathode target for forming a transparent thin film having a low refractive index of the present invention, it is possible to provide a transparent thin film having a low refractive index and excellent alkali resistance over a large area at a high speed under a stabilized condition. Further, by a combination with an oxide transparent thin film having a high refractive index, optical design for a thin film can be facilitated.

Further, the low refractive index film obtained by such a target has a chemical stability and thus is useful as an overcoat for various products. For example, it is most suitable as the outermost layer for e.g. a heat radiation reflecting glass for buildings or automobiles, a protecting plate for the read-out portion of a bar code reader, a reflection preventive film, or lenses for eye glasses, and it is widely useful for mechanical elements and can be used as a coating material for sliding parts.

What is claimed is:

1. A ceramic rotatable magnetron sputtering cathode target, comprising:
a cylindrical target holder having an outer surface and a ceramic layer as a sputtering target, which is formed on the outer surface of the cylindrical target holder, said sputtering cathode target having placed on the outer surface of the cylindrical target holder under the ceramic layer, a layer (i) of a metal or alloy having a thermal expansion coefficient of an intermediate level between the thermal expansion coefficients of the ceramic layer and the target holder, and a layer (ii) of a metal or alloy having a thermal expansion coefficient approximating the thermal expansion coefficient of the ceramic layer.

2. The ceramic rotatable magnetron sputtering cathode target according to claim 1, wherein the ceramic layer comprises, as the main components, at least one member selected from the group consisting of Zr, Ti, Ta, Hf, Mo, W, Nb, Sn, La, In and Cr, and at least one member selected from the group consisting of B (boron), Si (silicon) and O (oxygen).

3. The ceramic rotatable magnetron sputtering cathode target according to claim 1, wherein the ceramic layer comprises, as the main components, at least one member (hereinafter referred to as metal M) selected from the group consisting of Zr, Ti, Ta, Hf, Mo, W, Nb, Sn, La, In and Cr, and Si, wherein the atomic ratio of the total amount of metal M to Si (M:Si) is within a range of from 4:96 to 35:65.

* * * * *